(12) United States Patent
Hintze et al.

(10) Patent No.: US 7,416,952 B2
(45) Date of Patent: Aug. 26, 2008

(54) METHOD FOR PRODUCING A DIELECTRIC INTERLAYER AND STORAGE CAPACITOR WITH SUCH A DIELECTRIC INTERLAYER

(75) Inventors: Bernd Hintze, Langebrueck (DE);
Henry Bernhardt, Dresden (DE);
Frank Bernhardt, Dresden (DE)

(73) Assignee: Infineon Technologies AG, Munich (DE)

( * ) Notice: Subject to any disclaimer, the term of this patent is extended or adjusted under 35 U.S.C. 154(b) by 199 days.

(21) Appl. No.: 11/438,700

(22) Filed: May 23, 2006

(65) Prior Publication Data
US 2007/0272965 A1     Nov. 29, 2007

(51) Int. Cl.
*H01L 27/108* (2006.01)
*H01L 21/20* (2006.01)

(52) U.S. Cl. ............... 438/387; 257/301; 257/302; 257/303; 257/304; 257/305; 257/306; 257/310; 438/381; 438/386; 438/390; 438/391

(58) Field of Classification Search ......... 257/301–306, 257/310; 438/390–391, 386–387, 381
See application file for complete search history.

(56) References Cited

U.S. PATENT DOCUMENTS

| 2005/0233589 | A1 | 10/2005 | Aegerter et al. | |
|---|---|---|---|---|
| 2006/0102983 | A1* | 5/2006 | Iijima | 257/532 |
| 2007/0272965 | A1* | 11/2007 | Hintze et al. | 257/306 |

FOREIGN PATENT DOCUMENTS

EP     1 282 160     2/2003

OTHER PUBLICATIONS

German Office Action dated Jan. 24, 2007 directed to counterpart DE application No. 10 2006 024 214.

* cited by examiner

*Primary Examiner*—David Vu
*Assistant Examiner*—Arman Khosraviani
(74) *Attorney, Agent, or Firm*—Patterson & Sheridan, L.L.P.

(57) ABSTRACT

A dielectric interlayer, especially for a storage capacitor, is formed from a layer sequence subjected to a temperature process, wherein the layer sequence has at least a first metal oxide layer and a second metal oxide layer formed by completely oxidizing a metal nitride layer to higher valency.

7 Claims, 5 Drawing Sheets

METHOD FOR PRODUCING A DIELECTRIC INTERLAYER AND STORAGE CAPACITOR WITH SUCH A DIELECTRIC INTERLAYER

TECHNICAL FIELD OF THE INVENTION

The invention relates to a method for producing a dielectric interlayer, a method for producing a storage capacitor and a storage capacitor with such a dielectric interlayer, especially for use in a semiconductor storage cell, which is part of a semiconductor memory. The semiconductor memory is preferably a dynamic random access write-read memory (DRAM).

BACKGROUND OF THE INVENTION

Semiconductor memories, primarily DRAMs, are usually realized as a storage cell array on a semiconductor wafer. The storage cells comprises a storage capacitor and a selection transistor. In a read or write operation, respectively, the storage capacitor is charged or discharged, respectively, with an electrical charge corresponding to one data unit (bit) through the selection transistor. For this, the selection transistor is addressed through a bit- or wordline, respectively, by the aid of a peripheral logic having switching transistors.

A substantial center in the technological development of the semiconductor memories is the storage capacitor. In order to provide for sufficient storage capacity with small cross-sectional area, the storage capacitors are therefore realized in three-dimensional manner. As essential embodiments of three-dimensional storage capacitors, trench capacitors and stacked capacitors have gained acceptance. In trench capacitors, a trench is etched into the semiconductor substrate, which is filled with a dielectric interlayer and a first storage electrode layer, wherein a doped region of the semiconductor substrate around the trench serves as a second storage electrode layer. The selection transistor of the storage cell is usually formed on the semiconductor surface besides the trench capacitor as a planar field effect transistor, wherein the one transistor electrode is connected to the one electrode layer of the trench capacitor.

In contrast, stacked capacitors are formed on the surface of the semiconductor substrate, wherein a first storage electrode layer is realized in form of a crown, which is separated from a second storage electrode layer via a dielectric interlayer. The selection transistor of the storage cell is disposed in form of a planar field effect transistor below the stacked capacitor, wherein the one transistor electrode is connected to the crown-shaped storage electrode layer of the stacked capacitor.

Due to the continuously increasing downsizing of the semiconductor storage cells, also in three-dimensional storage capacitors, it is searched for additional possibilities to lower the area requirement and to increase the capacitor capacity at the same time.

Conventionally, in storage capacitors, material combinations of silica and/or silicon nitride are employed as the dielectric interlayer. However, for sub 100 nm structures, it is contemplated to replace the conventionally employed silica and/or silicon nitride layers by materials exhibiting a higher dielectric constant and thus allow increase of the storage capacity per unit area. As such so-called high k dielectrics, especially binary oxides such as alumina, tantalum oxide, hafnium oxide, zirconium oxide, oxides of the lanthanum group, alumina compounds and further single and mixed oxides are contemplated.

However, many of the contemplated high k dielectrics can only very difficulty be integrated into the standard process for producing storage capacitors within the bounds of the silicon planar technique, and especially only difficulty be formed as extremely thin layers. Further, the dielectric strength of many contemplated high k dielectrics is insufficient for employment in DRAM storage capacitors, especially concerning the long term stability. Furthermore, is has turned out that in many of the considered high k dielectrics, increased leakage currents occur with respect to the conventional material combinations of silica and/or silicon nitride, which entail shortened retaining time of the charge in the storage capacitor.

In employment of high k dielectrics within the bounds of the silicon planar technique, further, it has turned out that such layers result in high tensile stresses on the semiconductor surface, which in turn entails bending the semiconductor wafer. In employment of three-dimensional storage capacitors within the bounds of the DRAM production, due to the increased surface, therein, bends of several 100 μm can occur, whereby further processing the semiconductor substrate for device formation within the bounds of the silicon planar technique, wherein layers have to be applied consecutively precise in position, becomes nearly impossible. There is also the danger that the semiconductor wafer breaks due to the high stress.

These disadvantages especially apply to the employment of alumina ($Al_2O_3$) as a high k dielectric in storage capacitors, the preferred candidate for replacement of the conventional material combinations of silica and/or silicon nitride. Alumina distinguishes itself by being able to be relatively simply integrated into the standard process for producing storage capacitors within the bounds of the silicon planar technique. In producing storage capacitors with alumina as the dielectric interlayer within the bounds of the silicon planar technique, on a first capacitor electrode, which usually is a highly doped silicon layer, the alumina is deposited, which is subsequently thermally concentrated with a high-temperature process for improving the dielectric strength, for reducing the leakage current and for increasing the dielectric constant. Then, a second capacitor electrode layer, preferably a metal layer, is applied onto the alumina layer. In order to achieve sufficient dielectric strength with not too high leakage current at the same time, the concentrated alumina layer has to have a thickness of at least 5 nm, which results in high tensile stress on the substrate surface, which causes overlay problems in the subsequent processing.

With the employment of alumina, the dielectric constant of which is at 10, an increase of the storage capacity per unit area can be achieved over the conventionally employed dielectric interlayers of a material combination of silica and/or silicon nitride. However, compared to alumina, high k dielectrics with even substantially higher dielectric constant would be desirable for replacement of the conventionally employed silica and/or silicon nitride layers. Thus, e.g. titanium oxide (TiO) exhibits a dielectric constant of greater than 40. However, titanium oxide has only a low thermal stability. Further, in titanium oxide layers, high leakage currents occur, and the dielectric strength over the lifetime of the storage capacitor is insufficient. These disadvantages basically also result from most of the other contemplated binary metal oxides, such as tantalum oxide having a dielectric constant of 25, or hafnium oxide having a dielectric constant of 25 to 30.

In order to achieve dielectric interlayers of a high k dielectric with improved electrical and mechanical characteristics, therefore, increasingly, also mixed layers are employed. Preferably, they are produced in form of stacked layers with the aid of the atomic layer deposition (ALD) method, in which the mixed layer materials are applied separately from each other and mixed with a subsequent high-temperature process. Such an approach is described in US 2005/0233598 A1, among other things. Here, as the layer sequence, preferably, a metal oxide layer and silicon oxide or silicon oxy nitride are employed, respectively. However, the mixed layers proposed in US 2005/233598 A1 can only difficulty be integrated into the standard silicon planar technique methods. Further, the mixed layers also exhibit high leakage currents and an insufficient dielectric strength. However, primarily, the mixed layers result in high tensile stresses on the semiconductor surface and thus in strongly bending the semiconductor wafer.

There is a need for a method for producing a dielectric interlayer and for a storage capacitor with such a dielectric interlayer, which exhibit improved electrical and mechanical characteristics of the dielectric interlayer.

SUMMARY OF THE INVENTION

According to one embodiment of the present invention, there is a method for producing a dielectric interlayer, especially for use in a storage capacitor of a semiconductor memory cell, includes forming a first metal oxide layer, forming a metal nitride layer, oxidizing the metal nitride layer to higher valency to form a second metal oxide layer; and heating the layer sequence to form a mixed layer from the first and the second metal oxide layer.

According to another embodiment of the present invention, there is a method for producing a storage capacitor, especially for use in a semiconductor storage cell includes forming a first electrode layer, forming a dielectric interlayer on the first electrode layer and forming a second electrode layer on the dielectric interlayer. The dielectric interlayer is formed including the steps of forming a first metal oxide layer, forming a metal nitride layer, oxidizing the metal nitride layer to higher valency to form a second metal oxide layer and heating the layer sequence to form a mixed layer from the first and the second metal oxide layer.

According to still another embodiment of the present invention, there is a storage capacitor, especially for use in a semiconductor storage cell, including a first electrode layer, a second electrode layer and a dielectric interlayer disposed between the first electrode layer and the second electrode layer. The dielectric interlayer comprises a layer sequence subjected to a temperature process, which has at least a first metal oxide layer and a second metal oxide layer formed by completely oxidizing a metal nitride layer to higher valency.

BRIEF DESCRIPTION OF THE DRAWINGS

The present invention is described in more detail below with reference to the exemplary embodiments and drawings, in which.

It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

The invention is explained with reference to trench capacitors, which are produced within the bounds of the standard process sequence for forming DRAM storage cells based on silicon. However, alternatively to trench capacitors, also other storage capacitor forms can be realized in the manner according to the invention, especially three-dimensional storage capacitor forms. Such a three-dimensional storage capacitor, which can be realized in the form according to the invention, is e.g. the stacked capacitor.

The formation of the trench capacitors according to the invention is effected with the aid of the planar technique, which consists of a succession of individual processes each acting on the entire wafer surface, wherein a local change of the substrate is purposefully performed by suitable masking steps. In producing highly integrated circuits with storage capacitors, especially of DRAMs, a plurality of storage capacitors are formed at the same time. However, in the following, the invention is only presented with respect to the formation of a single storage capacitor as a trench capacitor.

Figure 1:
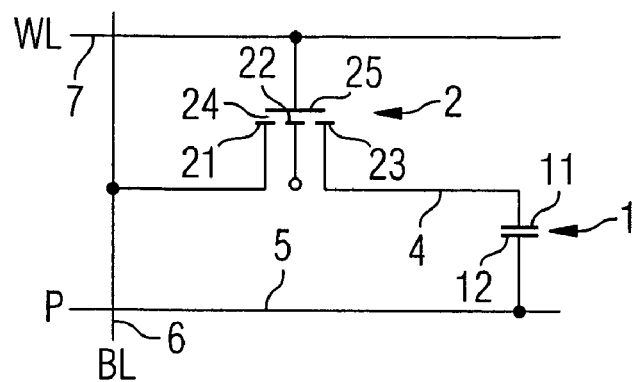
FIG. 1 shows a circuit diagram of a DRAM cell.

In DRAM memories, primarily single transistor cells are employed, the circuit diagram of which is shown in FIG. 1. These transistor cells consist of a storage capacitor 1 and a selection transistor 2. The selection transistor 2 is preferably formed as a field effect transistor and has a first electrode 21 and a second electrode 23, between which an active region 22 is disposed, in which a current conducting channel can form between the first electrode 21 and the second electrode 23. Above the active region 22, an isolator layer 24 and a gate electrode 25 are formed, which act like a plate capacitor, by which the charge density in the active region 22 can be influenced.

The second electrode 23 of the selection transistor 2 is connected to a first electrode 11 of the storage capacitor 1 through an electrical connection 4. A second electrode 12 of the storage capacitor 1 is in turn connected to a conducting connection 5, which is preferably common to all of the storage capacitors of the DRAM memory. Further, the first electrode 21 of the selection transistor 3 is connected to a bitline 6 to be able to read in and out the information stored in the storage capacitor in form of charges. Therein, the reading-in or reading-out operation is controlled through a wordline 7, which is connected to the gate electrode 25 of the selection transistor 2, in order to establish a current conducting channel in the active region 22 between the first electrode 21 and the second electrode 23 of the selection transistor 2 by applying a voltage.

In many cases, in dynamic storage cells, trench capacitors are employed as storage capacitors, since by the three-dimensional structure, a substantial decrease of the storage cell area can be achieved. However, with increasing miniaturization of the storage cells, with a scaling size below 100 nm, additional measures are required to be able to satisfy three basic requirements to a dynamic storage cell in a DRAM memory, namely a sufficiently great storage capacity of ca. 25 to 40 fF, which is required for reliable detection of the charge stored in the storage capacitor, a packaging-dense and structurally friendly cell layout, which provides for minimum chip area and thus for reduced cost, as well as a high electrical performance, i.e. long retaining time of the charge in the storage capacitor, a high dielectric strength and high lifetime.

In order to provide for sufficient storage capacity with reduced storage capacitor cross-section, the dielectric interlayer of silica and/or silicon nitride conventionally employed in the storage capacitors between the two capacitor electrodes is replaced by a high k dielectric with a higher dielectric constant. This approach allows to downsize the capacitor dimensions and to achieve a storage capacity required for reliable detection of the charge contained in the storage capacitor.

Preferred materials are binary metal oxides such as alumina. Alumina can be integrated into the standard process sequence for forming storage capacitors with the aid of the silicon planar technique in simple manner. Moreover, alumina exhibits a high temperature stability, a great dielectric strength as well as a low leakage current. With a dielectric constant of 10, alumina provides for increased storage capacity per unit area with respect to the conventionally employed silica and/or silicon nitride layers.

However, within the bounds of the desired downsizing of the semiconductor storage cells, for increasing the storage capacity per unit area compared to alumina, high k dielectrics with an even substantially higher dielectric constant would be desirable. Possible metal oxide candidates are here e.g. zirconium oxide with a dielectric constant of 11 to 25 and hafnium oxide with a dielectric constant of 25 to 30. Also lanthanum oxide with a dielectric constant of 20 to 25 as well as yttrium oxide with a dielectric constant between 11 and 12 can be employed. However, with the above-mentioned metal oxides, there are difficulties in integrating into the standard silicon planar process. Moreover, usually also high leakage currents occur, which result in shortened retaining time of the charge in the storage capacitor.

However, with all metal oxides, including alumina, which are contemplated as high k dielectrics, it is problematic that such layers entail high tensile stresses on the semiconductor surface, which results in bending the semiconductor wafer. In employing three-dimensional storage capacitors within the bounds of the DRAM production, due to the increased surface, deflections of several 100 μm can occur therein, which makes a further processing of the semiconductor substrate for device production within the bounds of the silicon planar technique, wherein the layers have to be consecutively applied precise in position, nearly impossible. Due to the high stress, there is also the danger that the semiconductor wafer breaks.

In order to improve the electrical and mechanical characteristics of the high k dielectrics, also mixed layers are increasingly employed. Herein, alumina compounds such as Hf—Al—O, Zr—Al—O or La—Al—O are considered. Further, high k dielectrics with a metal silicate compound such as Hf—Si—O, Zr—Si—O or La—Si—O are contemplated. These alumina and metal silicate compounds exhibit a dielectric constant of greater than 14 with a temperature stability up to 900° C. Such mixed compounds can be produced with the aid of atomic layer deposition, wherein the individual materials are consecutively applied as thin layers and subsequently mixed by the aid of a high-temperature process. However, also in employing such mixed layers based on alumina and metal silicate, high tensile stresses on the semiconductor surface arise, which results in great deflection and makes further processing of the semiconductor wafer nearly impossible. Furthermore, in employing these mixed layers as dielectric interlayers in storage capacitors, often reliability problems also occur. This relates especially to the dielectric strength and the leakage currents determining the retaining time of the charges in the storage capacitor.

In order to reduce one or more of the above disadvantages in employing high k dielectrics as dielectric interlayers in storage capacitors, the dielectric interlayer according to the invention, especially for use in a storage capacitor in a semiconductor storage cell, has a layer sequence of a first metal oxide layer and a metal nitride layer, which is completely oxidized to higher valency to form a second metal oxide layer. This layer sequence is then subjected to a high-temperature process to form a mixed layer of the first metal oxide layer and the second metal oxide layer. The employment of a mixed layer of two metal oxide layers allows to optimally adjust the dielectric constant as well as the remaining electrical characteristics, especially the leakage current through the layer as well as the dielectric strength thereof in customized manner by controlling the metal properties as well as the layer thicknesses.

The application of the second metal oxide layer in form of a metal nitride layer, which is subsequently oxidized to higher valency, provides for widely preventing a stress of the semiconductor surface and thereby deflection. Namely, the oxidized metal nitride layer compensates for the tensile stress caused by the first metal oxide layer.

The first metal oxide is preferably formed from any of alumina, titanium oxide, tantalum oxide, hafnium oxide, zirconium oxide and an oxide of the lanthanum group. Preferably, any of aluminum nitride, titanium nitride, tantalum nitride, hafnium nitride, zirconium nitride silicon nitride and a nitride of the lanthanum group is employed as the metal nitride. Therein, preferably alumina is to be employed as the first metal oxide, and titanium nitride as the metal nitride, since alumina and titanium nitride can easily be integrated into the standard silicon planar process. Moreover, titanium nitride can be easily completely oxidized to higher valency even at low temperatures. The alumina/titanium oxide mixed layer formed by the high-temperature process exhibits excellent mechanical and electrical characteristics, especially a low leakage current, a high dielectric strength as well as a high storage capacity per unit area. Further, by formation of the mixed layer from an alumina layer and fully oxidized titanium nitride layer, an excellent layer quality without stresses on the semiconductor surface is achieved.

Figure 3:
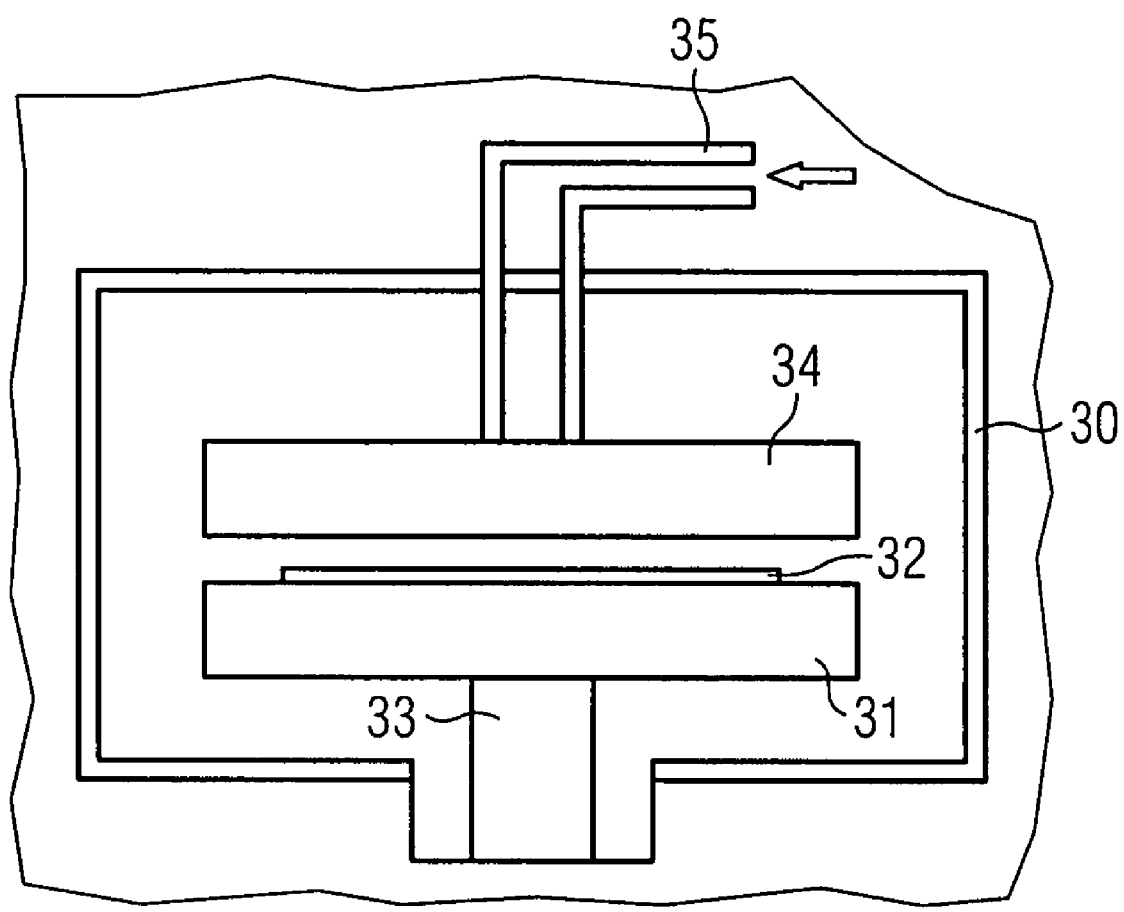
FIG. 3 shows an atomic layer deposition equipment for producing a dielectric interlayer according to the invention.

The layer stack for forming the mixed layer is preferably produced with the aid of the atomic layer deposition (ALD) method. An ALD reactor of the showerhead type is shown in FIG. 3. The reactor is composed of a reactor chamber 30 with a heatable support plate 31, on which a substrate disk 32 to be processed is disposed. Further, a vacuum port 33 is provided. Opposing the support plate 31 with the substrate disk 32, a so-called showerhead 34 with a plurality of parallel disposed gas exit openings is disposed, which is connected to process gas conduits 35. The vertical gas flow is characteristic of the showerhead type reactor. Alternatively, also a flow type reactor with a horizontal gas flow or a batch device can be employed.

In layer generation with the aid of the ALD reactor, the individual materials are consecutively introduced into the reactor chamber in form of precursors, wherein the chemical reaction for forming the layer exclusively occurs on the substrate surface. The introduction of the various reactive gases for forming the layer is separated from each other by interposed inert gas steps, by which the reactor chamber is purged before introduction of the next precursor. With the ALD method, extremely thin layers of only few atomic layers can be generated.

According to the invention, in formation of the high k dielectric mixed layer, it is proceeded such that first the first metal oxide layer, then the metal nitride layer and subsequently once again the first metal oxide layer are applied. The individual layer thicknesses are preferably in the range of 0.5 to 2 nm. The oxidation of the metal nitride layer to higher valency is effected before application of the second layer of the first metal oxide layer with the aid of the oxygen precursor of the first metal oxide layer. For this, after application of the metal nitride layer, the oxygen precursor, e.g. ozone, is introduced into the reactor chamber and the substrate surface is heated to a temperature of 300° C. to 400° C. At this temperature, then complete oxidation of the thin metal nitride layer to the second metal oxide layer is effected. Subsequently, then, further metal precursor for the first metal oxide layer is introduced to form a second layer of the first metal oxide layer.

After applying the entire layer sequence, then a high-temperature process at preferably above 1000° C. is carried out to generate the mixed layer. Instead of a separate high-temperature step, there is also the possibility to utilize one of the high temperature steps employed within the bounds of the subsequent device production for mixing. The approach according to the invention can be simply integrated into the standard silicon planar process, wherein only a single reaction chamber is required by employment of the ALD process for layer production, which makes the process inexpensive and fast.

Figure 2:
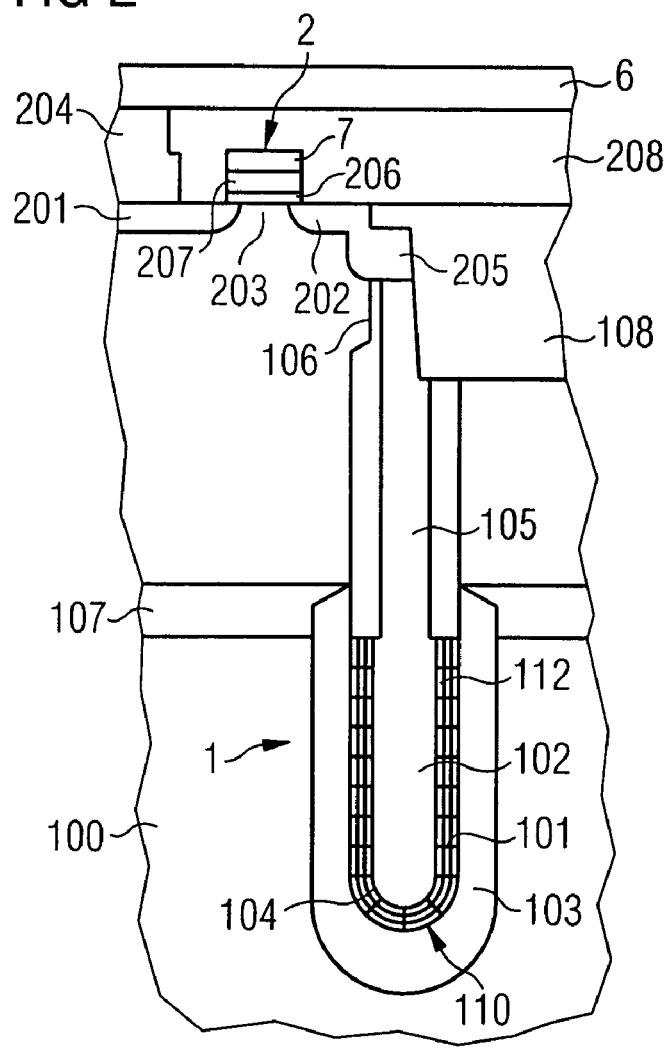
FIG. 2 shows a schematic cross-section through a DRAM cell with a storage capacitor in form of a trench capacitor having a dielectric interlayer according to the invention.

FIG. 2 shows a possible embodiment of a storage capacitor 1 according to the invention as a trench capacitor. Therein, the trench capacitor 1 is formed in a preferably single-crystal silicon substrate 100. The silicon substrate 100 is preferably heavy p (p+) doped, e.g. with boron (B). A trench 101 is realized in the silicon substrate 100, which is composed of a narrower upper trench region and a wider lower trench region. Such a trench shape can be generated e.g. by a two-step etching process resulting in the bottle shape of the trench 101 shown in FIG. 2. Around a first lower section of the trench 101, a highly n (n+) doped layer 103 is formed, which for example is doped with arsenic. This n+ doped layer constitutes the outer capacitor electrode of the trench capacitor 1 as a buried plate.

On the trench wall in the lower region, further, a dielectric layer 110 composed of three layers is formed. Therein, the first layer is a 0.5 nm to 2 nm thick alumina layer, the second layer is a 0.5 nm to 2 nm thick titanium oxide layer, which is formed by completely oxidizing a titanium nitride layer to higher valency, and the third layer is a 0.5 nm to 2 nm thick alumina layer. The three layers are mixed by a high-temperature step. Instead of a three layer stack, there is the possibility to apply still further layers in alternating manner, wherein the first and the last layer preferably always consist of alumina. Alternatively to alumina, also another one of the above-mentioned metal oxides can be employed. The same applies to titanium nitride, which can also be replaced by another one of the above-mentioned metal nitrides.

The trench 101 is then filled with an n+ doped filling layer 105, preferably a polysilicon layer, as the inner capacitor electrode. The selection transistor 2 of the DRAM cell in the embodiment shown in FIG. 2, has two diffusion regions 201, 202, which are generated by implanting doping atoms into the silicon substrate 100 and separated by a channel 203. The first diffusion region 201 serves as a first electrode layer 21 of the selection transistor 2 and is connected to a bitline 6 through a contact layer 204. The second diffusion region 202 is connected to the n+ doped filling layer 105, which constitutes the inner capacitor electrode with the metal layer 104, through a capacitor terminal 205. The channel 203 is further separated by a dielectric layer 206 from a gate electrode layer 207, which is part of a wordline 7.

In the upper region of the trench, an isolator layer 106 is provided adjoining the dielectric layer between the trench wall and the filling layer 105 of the trench capacitor 1. This isolator layer 206 prevents that a parasitic transistor forms between the capacitor terminal 205 and the buried plate 103 along the trench. Therein, preferably, silica is employed as the isolator layer 106. In the silicon substrate, further an n+ doped well 107 is provided, which serves as a connection of the buried plate 103 to the buried plates of the further DRAM storage cells. For isolating the DRAM cells from each other, an isolating trench 108 (STI isolation) is formed. The gate electrode layer 207 and the wordline 7 are isolated from the bitline 6 in the contact layer 204 by an oxide layer 208.

An operation of reading-in and reading-out the DRAM cell is controlled through the wordline 7 connected to the gate electrode layer 207 of the selection transistor to establish a current conducting channel 103 between the diffusion regions 201, 202 by applying a voltage, such that information in form of charge in the metal layer 104 in the trench 101 can be read in and out through the terminal layer 205.

By the design of the dielectric interlayer according to the invention as a layer sequence subjected to a temperature process, which has at least a first metal oxide layer and a second metal oxide layer, which is formed by complete oxidation of a metal nitride layer to higher valency, the electrical performance of the trench capacitor and thereby of the DRAM cell can be improved and at the same time the mechanical tension and wafer bending can be decreased.

FIGS. 4A to 4E show a method for producing storage capacitors according to the invention as a trench capacitor with a dielectric interlayer, which is a mixed layer generated by a high-temperature process, consisting of a first $Al_2O_3$ layer, a fully oxidized TiN layer and a second $Al_2O_3$ layer, within the bounds of a standard DRAM process.

Figure 4A:
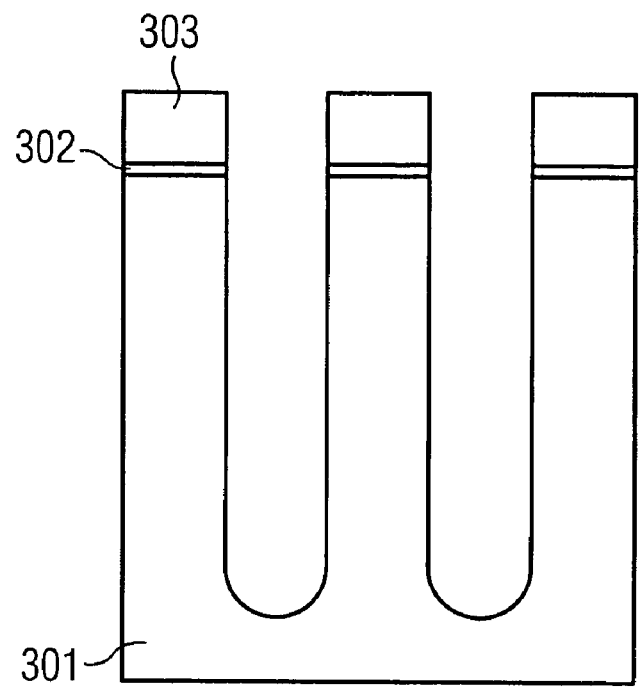
FIGS. 4A to 4E show a method according to the invention for producing a storage capacitor within the bounds of a standard DRAM process flow.

As illustrated in FIG. 4A, in a first process step, the trenches (two shown) for the trench capacitors are formed in a p+ doped silicon substrate 301. For this, an oxide layer 302 and a nitride layer 303 are consecutively generated on the silicon surface. Subsequently, the regions of the trench capacitors are defined with a mask layer on the silicon surface in known manner and trenches are etched by a first etch to a depth of up to 10 µm.

Figure 4B:
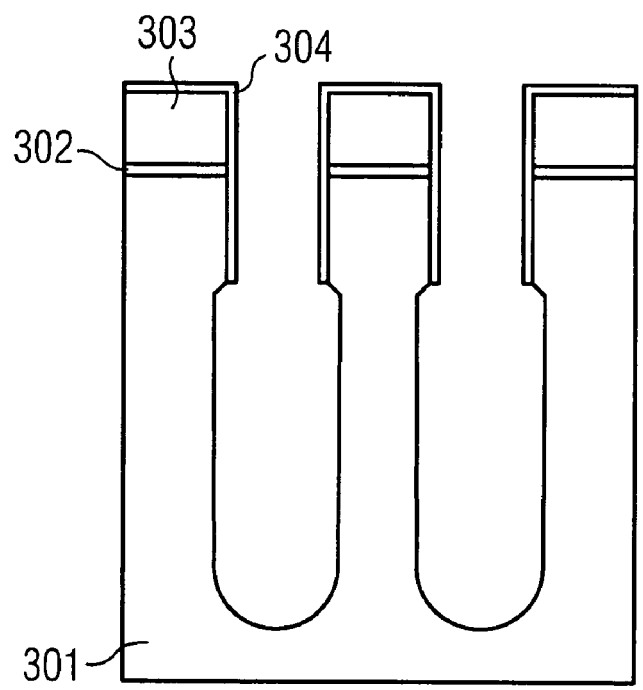

In a next process step, then, a thin etch-resistant layer 304 is deposited to cover the upper region of the trench. The etch-resistant layer 304 serves as an etch mask for a further etch step, in which the trenches in the lower trench region are extended. A cross-section through the silicon wafer after this process step is illustrated in FIG. 4B.

Figure 4C:
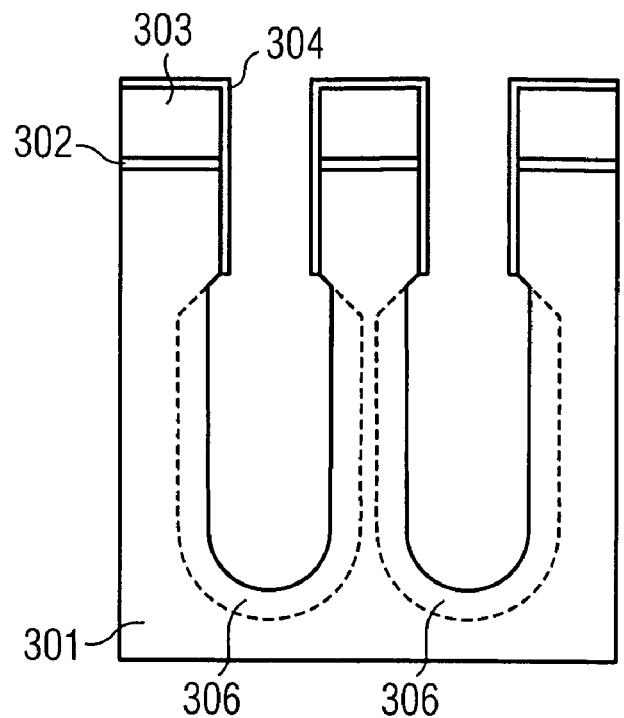

In another process sequence, the n+ doped buried plate 306 is formed. For this, the silicon substrate is doped with arsenic such that the n+ doped layer 306 results around the extended region of the trench. A cross-section through this silicon wafer after this process step is illustrated in FIG. 4C.

Figure 4D:
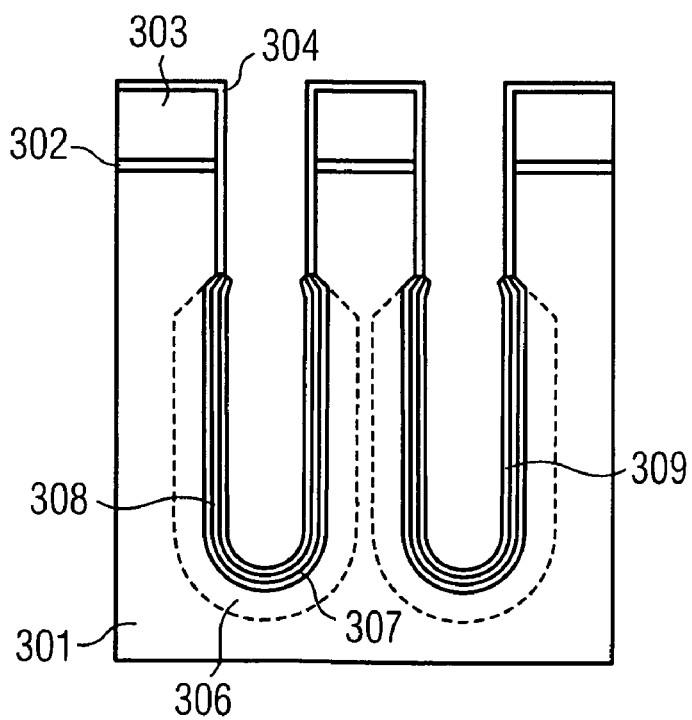
Figure 4E:
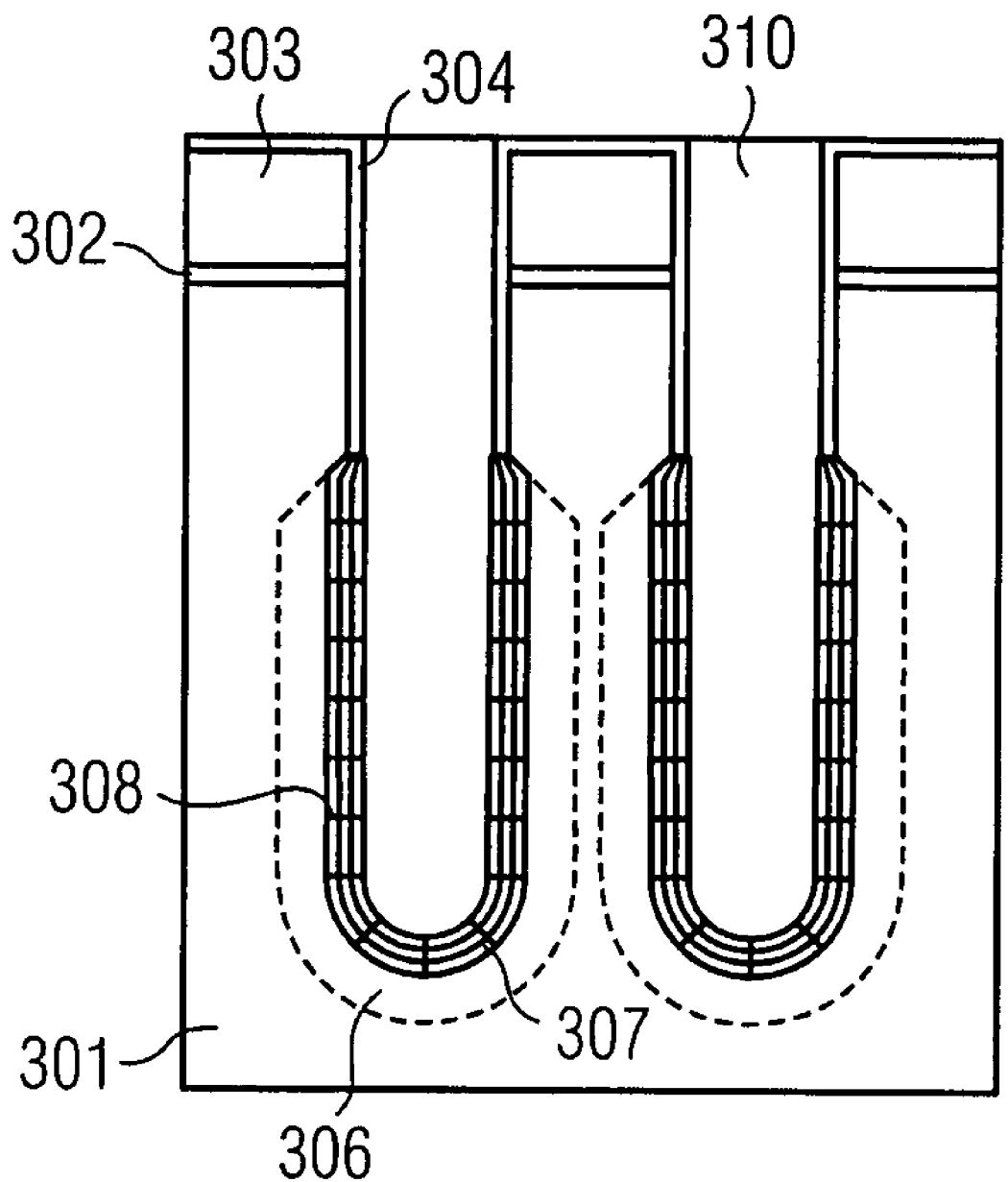

In a next process, now, a dielectric interlayer is formed in the manner according to the invention. This is preferably effected with an ALD reactor as is shown in FIG. 3. For this, in a first step, an alumina layer 307 is grown in the lower section on the trench wall with a layer thickness of 0.5 to 2 nm. Subsequently, a titanium nitride layer is generated also with a thickness of 0.5 to 2 nm. The titanium nitride layer is then completely oxidized to higher valency by introducing the oxygen precursor for generating the alumina layer and heating the semiconductor wafer to a temperature of 300° C. to 400° C. After completely oxidizing the titanium nitride layer to the titanium oxide layer 308, then again a further alumina layer 309 having a thickness of 0.5 to 2 nm is generated. The cross-section through the silicon wafer after these process steps is illustrated in FIG. 4D. Subsequently, for generating a mixed layer, a high-temperature step, preferably at a temperature of 1000° C. and more, is then carried out in order to produce an alumina/titanium oxide mixed layer.

In another process sequence, then, the inner capacitor electrode is produced by subsequently filling the trench with a conductive filling layer 310, preferably n+ doped polysilicon. A cross-section through the silicon wafer after this process step is illustrated in FIG. 3E. The storage capacitor can then be coupled to a selection transistor within the bounds of the known standard process sequence to produce DRAM storage cells.

With the dielectric interlayer according to the invention in storage capacitors comprising a layer sequence subjected to a temperature process, which has at least a first metal oxide layer and a second metal oxide layer formed by completely oxidizing a metal nitride layer to higher valency, the electrical characteristics of the storage capacitor concerning dielectric strength, long-term stability and capacity, are improved and at the same time, an improved integration into the standard process sequences for forming highly integrated circuits is achieved.

The formation of the dielectric interlayer from a layer stack consisting of two metal oxide layers, which are mixed by the aid of a high-temperature process, allows forming the dielectric interlayer in customized manner with a high dielectric constant. At the same time, with such a mixed layer of two metal oxides, improved electrical characteristics, especially an increased dielectric strength over the individual high k dielectric layer, can be achieved. Further, with such a mixed layer, also the leakage current is reduced to a minimum.

By formation of the second metal oxide layer from a metal nitride layer, which is completely oxidized to higher valency, further, the stress of the semiconductor wafer can be substantially decreased due to the tensile stress caused by the first metal oxide layer, and thus deflection of the semiconductor wafer can be prevented.

Therein, it is preferred to form the first metal oxide layer from any of alumina, titanium oxide, tantalum oxide, hafnium oxide, zirconium oxide and an oxide of the lanthanum group, and to employ any of aluminum nitride, titanium nitride, tantalum nitride, hafnium nitride, zirconium nitride, silicon nitride and a nitride of the lanthanum group as the metal nitride. A mixed layer produced from these materials exhibits improved electrical and mechanical characteristics.

This applies especially to a material combination, in which the first metal oxide layer is composed of alumina and the metal nitride layer oxidized to higher valency is composed of titanium nitride. Alumina exhibits good integration into the standard process for producing storage capacitors within the bounds of the silicon planar technique. The employment of oxidized titanium nitride as a further layer in the layer stack provides for widely compensating for the high tensile stress caused in production of the alumina layer on the substrate surface. Then, the subsequent mixing with the alumina layer provides for a substantially higher dielectric constant with respect to a pure alumina layer. The advantage of such a mixed layer of an alumina layer and a titanium oxide layer over a pure titanium oxide layer is a greatly reduced leakage current as well as the distinctly higher dielectric strength over the lifetime.

It is further preferred that the first metal oxide layer and the metal nitride layer are formed with the aid of an atomic layer deposition, wherein a further first metal oxide layer is applied onto the metal nitride layer. The oxidation of the metal nitride layer to higher valency before producing the further first metal oxide layer is effected with the aid of the oxygen precursor of the first metal oxide layer. This approach allows simple oxidation to higher valency without change of equipment, which can be integrated into the standard silicon planar process in simple manner.

While the foregoing is directed to embodiments of the present invention, other and further embodiments of the invention may be devised without departing from the basic scope thereof, and the scope thereof is determined by the claims that follow.

What is claimed is:

1. A method for producing a dielectric interlayer for use in a storage capacitor of a semiconductor memory cell, comprising:
   forming a first metal oxide layer;
   forming a metal nitride layer;
   oxidizing the metal nitride layer to higher valency to form a second metal oxide layer; and
   heating the layer sequence to form a mixed layer from the first and the second metal oxide layer.

2. The method according to claim 1, wherein
   the first metal oxide is any of alumina, titanium oxide, tantalum oxide, hafnium oxide, zirconium oxide and an oxide of the lanthanum group, and
   the metal nitride is any of aluminum nitride, titanium nitride, tantalum nitride, hafnium nitride, zirconium nitride, silicon nitride and a nitride of the lanthanum group.

3. The method according to claim 2, wherein the first metal oxide is alumina and the metal nitride is titanium nitride.

4. The method according to any claim 1, wherein the layers are formed with an atomic layer deposition.

5. The method according to claim 4, wherein a further first metal oxide layer is applied onto the second metal oxide layer, wherein oxidizing the metal nitride layer to higher valency to form the second metal oxide layer is effected by the aid of the oxygen precursor of the first metal oxide layer.

6. A method for producing a storage capacitor for use in a semiconductor storage cell, comprising:
   forming a first electrode layer;
   forming a dielectric interlayer on the first electrode layer; and
   forming a second electrode layer on the dielectric interlayer;
   wherein the dielectric interlayer is formed including:
      forming a first metal oxide layer;
      forming a metal nitride layer;
      oxidizing the metal nitride layer to higher valency to form a second metal oxide layer; and
      heating the layer sequence to form a mixed layer from the first and the second metal oxide layer.

7. The method according to claim 6, wherein a trench is realized in a semiconductor substrate,
   the first electrode layer is formed in the semiconductor substrate around the trench,
   the dielectric interlayer is realized on the trench wall, and
   the second electrode layer is formed on the dielectric interlayer.

* * * * *